US009608018B2

United States Patent
Kim et al.

(10) Patent No.: US 9,608,018 B2
(45) Date of Patent: Mar. 28, 2017

(54) LIQUID CRYSTAL DISPLAY DEVICE AND METHOD OF MANUFACTURING THE SAME

(71) Applicant: LG Display Co., Ltd., Seoul (KR)

(72) Inventors: Kyoung-Wook Kim, Daegu (KR); Ki Taeg Shin, Daegu (KR); Hee Won Lee, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 71 days.

(21) Appl. No.: 14/522,553

(22) Filed: Oct. 23, 2014

(65) Prior Publication Data

US 2015/0116622 A1   Apr. 30, 2015

(30) Foreign Application Priority Data

Oct. 25, 2013   (KR) .................. 10-2013-0128040

(51) Int. Cl.
*G02F 1/1362* (2006.01)
*H01L 27/12* (2006.01)
*G02F 1/1343* (2006.01)

(52) U.S. Cl.
CPC ........ *H01L 27/1296* (2013.01); *G02F 1/1362* (2013.01); *G02F 1/134363* (2013.01); *G02F 2201/123* (2013.01)

(58) Field of Classification Search
CPC ................ G02F 1/134363; G02F 1/133512
See application file for complete search history.

(56) References Cited

U.S. PATENT DOCUMENTS

| 2006/0139543 | A1* | 6/2006 | Kim | G02F 1/134363 349/141 |
|---|---|---|---|---|
| 2009/0262286 | A1* | 10/2009 | Nishida | G02F 1/133555 349/114 |
| 2010/0123866 | A1* | 5/2010 | Chang | G02F 1/136286 349/141 |
| 2012/0019747 | A1* | 1/2012 | Nakayoshi | G02F 1/136213 349/106 |

(Continued)

FOREIGN PATENT DOCUMENTS

| CN | 101697051 | * 4/2010 | ........... G02F 1/1362 |
|---|---|---|---|
| CN | 101697051 A | 4/2010 | |

(Continued)

OTHER PUBLICATIONS

Office Action for Chinese Patent Application No. CN 201410575596.8, Dec. 29, 2016, 19 Pages.

*Primary Examiner* — Sang V Nguyen
(74) *Attorney, Agent, or Firm* — Fenwick & West LLP

(57) ABSTRACT

Disclosed are an LCD device and a method of manufacturing the same, which reduce a capacitance deviation between pixels without any change in a viewing angle and a high transmittance. The LCD device includes a plurality of gate lines formed in a first direction on a substrate, a plurality of data lines formed in a second direction to intersect the plurality of gate lines, a thin film transistor (TFT) formed in each of a plurality of pixel areas defined by the plurality of gate lines and the plurality of data lines, a pixel electrode formed in a tetragonal shape in each of the plurality of pixel areas, and a common electrode formed on the pixel electrode, and configured to include a plurality of finger patterns. Each of the plurality of pixel areas is formed in a tetragonal shape.

13 Claims, 7 Drawing Sheets

(56) References Cited

U.S. PATENT DOCUMENTS

| | | | | |
|---|---|---|---|---|
| 2012/0133865 A1* | 5/2012 | Yonemura | G02F 1/133512 | |
| | | | | 349/96 |
| 2012/0169958 A1* | 7/2012 | Lee | G02F 1/133308 | |
| | | | | 349/58 |
| 2012/0206512 A1* | 8/2012 | Kim | G02F 1/133514 | |
| | | | | 345/691 |
| 2012/0320320 A1* | 12/2012 | Chen | G02F 1/133707 | |
| | | | | 349/106 |
| 2013/0320333 A1* | 12/2013 | Koyama | H01L 27/1461 | |
| | | | | 257/43 |
| 2014/0055728 A1* | 2/2014 | Oono | G02F 1/133514 | |
| | | | | 349/106 |
| 2014/0368770 A1* | 12/2014 | Chae | G02F 1/133514 | |
| | | | | 349/96 |

FOREIGN PATENT DOCUMENTS

| | | | | |
|---|---|---|---|---|
| CN | 102243382 | * | 11/2011 | G02F 1/13 |
| CN | 102243382 A | | 11/2011 | |
| CN | 102629045 A | | 8/2012 | |

* cited by examiner

LIQUID CRYSTAL DISPLAY DEVICE AND METHOD OF MANUFACTURING THE SAME

CROSS-REFERENCE TO RELATED APPLICATIONS

This application claims the benefit of the Korean Patent Application No. 10-2013-0128040 filed on Oct. 25, 2013, which is hereby incorporated by reference as if fully set forth herein.

BACKGROUND

Field of the Invention

The present invention relates to a liquid crystal display (LCD) device, and more particularly, to an LCD device and a method of manufacturing the same, which reduce a capacitance deviation between pixels without any change in a viewing angle and a transmittance.

Discussion of the Related Art

With the advance of various portable electronic devices such as mobile communication terminals, smart phones, tablet computers, notebook computers, etc., the demand for flat panel display (FPD) devices applicable to the portable electronic devices is increasing.

Liquid crystal display (LCD) devices, plasma display panels (PDPs), field emission display (FED) devices, organic light emitting display devices, etc. have been developed as the FPD devices.

In such FPD devices, applications of the LCD devices have expanded because the LCD devices can be easily manufactured due to the advance of manufacturing technology, ease of implementation, low power consumption, a high-quality image, and a large screen.

FIG. 1 is a diagram illustrating a pixel structure of a related art LCD device. FIG. 1 illustrates a portion of a plurality of pixels which are formed in a liquid crystal panel, and illustrates a pixel structure of a thin film transistor (TFT) array substrate (a lower substrate) in an in-plane switching (IPS) mode. In FIG. 1, a color filter array substrate (an upper substrate), a backlight unit, and a driving circuit unit are not illustrated.

Referring to FIG. 1, a plurality of pixels are formed on the TFT array substrate of the liquid crystal panel, and are defined by a plurality of gate lines 10 and a plurality of data lines 20 which are formed to intersect.

A TFT 30 is formed in each of a plurality of areas defined by intersections between the gate lines 10 and the data lines 20.

The TFT 30 is formed in a bottom gate type, and includes a gate electrode G of which an area extends from the gate line 10, a source electrode S which extends from the data line 20, an active layer formed of a semiconductor material, and a drain electrode D.

A pixel electrode 40 for supplying a data voltage based on image data input from the outside is formed in each of the plurality of pixels, and a common electrode 50 is formed on the pixel electrode 40.

The drain electrode D of the TFT 30 is connected to the pixel electrode 40 through a contact hole. In order to prevent a loss of an aperture ratio of each pixel, the contact hole is formed in a storage capacitor (Cst) area. The common electrode 50 is patterned to have a finger shape in each pixel, and is formed in common in all the pixels.

A finger pattern of the common electrode 50 is formed to be inclined at a certain angle, and the pixel electrode 40 is formed to be inclined at a substantially same angle as that of the finger pattern.

The pixels of the related art LCD device illustrated in FIG. 1 are formed in a 2-domain structure where upper and lower pixels are formed in different forms. Therefore, in comparison with a 1-domain structure, the 2-domain structure improves a viewing angle, and solves a drawback of a color shift.

However, the data lines are alternately formed to be inclined at a certain angle. Therefore, a profile of each pixel is formed in a trapezoid shape, and two pixels which are adjacent in a horizontal direction are formed in a connected form.

As described above, when the pixels are formed in a trapezoid shape, in a manufacturing process, a plurality of metal layers may be formed to be distorted without properly overlapping each other.

Therefore, areas in which the metal layers overlap each other differ in each pixel, and thus, capacitances of the pixels differ. For this reason, line dim in a height direction and a width direction, and flicker may occur, causing the degradation in a quality of an image.

SUMMARY

Accordingly, the present invention is directed to provide an LCD device and a method of manufacturing the same that substantially obviate one or more problems due to limitations and disadvantages of the related art.

An aspect of the present invention is directed to provide an LCD device and a method of manufacturing the same, which can prevent a capacitance deviation between pixels from occurring.

Another aspect of the present invention is directed to provide an LCD device and a method of manufacturing the same, which can prevent a quality of an image from being degraded by line dim in a horizontal and vertical direction, and flicker.

In addition to the aforesaid objects of the present invention, other features and advantages of the present invention will be described below, but will be clearly understood by those skilled in the art from descriptions below.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided an LCD device including: a plurality of gate lines disposed in a first direction on a substrate; a plurality of data lines disposed in a second direction to intersect the plurality of gate lines; a thin film transistor (TFT) disposed in each of a plurality of pixel areas defined by the plurality of gate lines and the plurality of data lines; a pixel electrode disposed in a tetragonal shape in each of the plurality of pixel areas; and a common electrode disposed on the pixel electrode, and configured to include a plurality of finger patterns, wherein each of the plurality of pixel areas is disposed in a tetragonal shape.

In another aspect of the present invention, there is provided a method of manufacturing a liquid crystal display (LCD) device including: forming a plurality of gate lines in a first direction on a substrate, and forming a gate electrode of a thin film transistor (TFT); forming a gate insulator to cover the plurality of gate lines and the gate electrode; forming an active layer on the gate insulator in an area which overlaps the gate electrode; forming a plurality of data lines in a second direction on the substrate, and forming a source electrode and a drain electrode of the TFT; forming a first passivation layer and a planarizing layer to cover the plurality of data lines and the TFT, and forming a contact hole to expose a top of the drain electrode; forming a pixel electrode in a tetragonal shape in each of a plurality of pixel areas defined by intersections between the plurality of gate lines and the plurality of data lines; forming a second passivation layer to cover the pixel electrode; and forming a common electrode, which includes a plurality of finger patterns, on the second passivation layer, wherein each of the plurality of pixel areas is formed in a tetragonal shape.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the exemplary embodiments of the present invention, examples of which are illustrated in the accompanying drawings. Wherever possible, the same reference numbers will be used throughout the drawings to refer to the same or like parts.

Hereinafter, an LCD device and a method of manufacturing the same according to embodiments of the present invention will be described in detail with reference to the accompanying drawings.

In description of embodiments of the present invention, when a structure (for example, an electrode, a line, a wiring, a layer, or a contact) is described as being formed at an upper portion/lower portion of another structure or on/under the other structure, this description should be construed as including a case where the structures contact each other and moreover a case where a third structure is disposed therebetween.

Terms "upper portion/lower portion" and "on/under" are for describing a configuration of an LCD device with a built-in touch sensor and a method of manufacturing the same according to an embodiment of the present invention with reference to the drawings. Therefore, the terms "upper portion/lower portion" and "on/under" may differ in structure during a manufacturing process and after manufacturing is completed.

LCD devices have been variously developed in a twisted nematic (TN) mode, a vertical alignment (VA) mode, an in-plane switching (IPS) mode, and a fringe field switching (FFS) mode according to a scheme of adjusting the alignment of liquid crystal.

Among different modes, the IPS mode and the FFS mode have a plurality of pixel electrodes and common electrodes arranged on a lower substrate, and thus, the alignment of liquid crystal is adjusted with electric fields between the pixel electrodes and the common electrodes.

Figure 1:
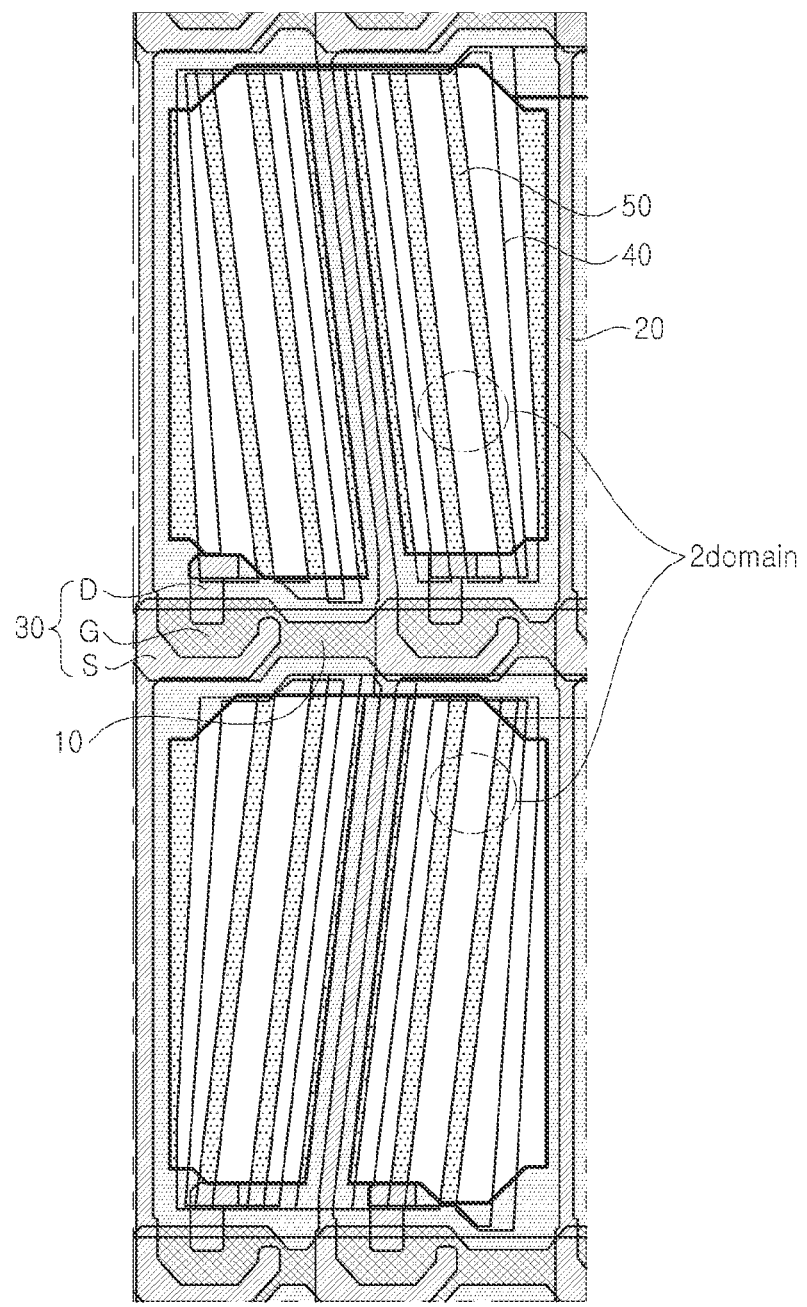
FIG. 1 is a diagram illustrating a pixel structure of a related art LCD device.
Figure 2:
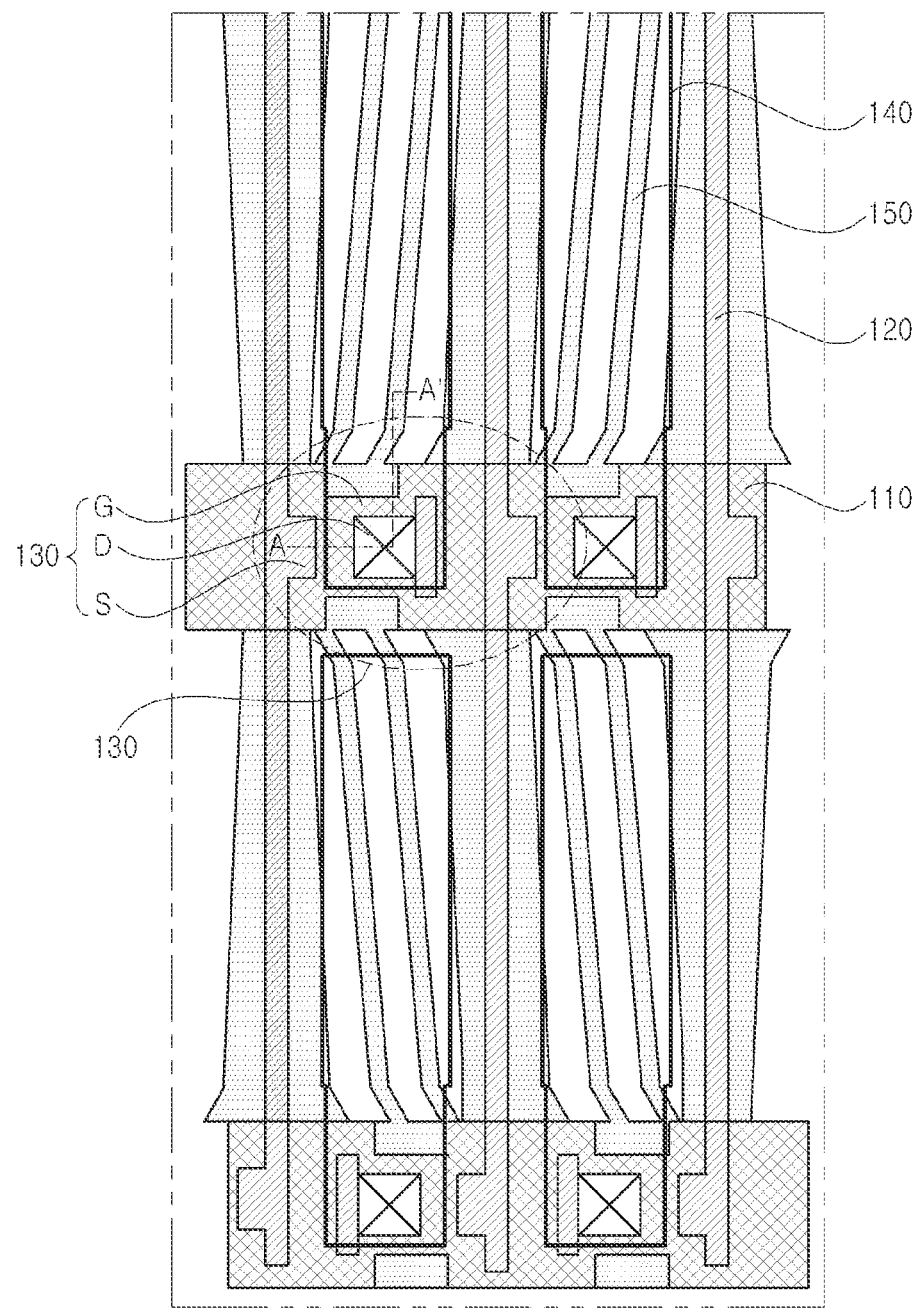
FIG. 2 is a diagram illustrating a pixel structure of an LCD device according to an embodiment of the present invention.
Figure 3:
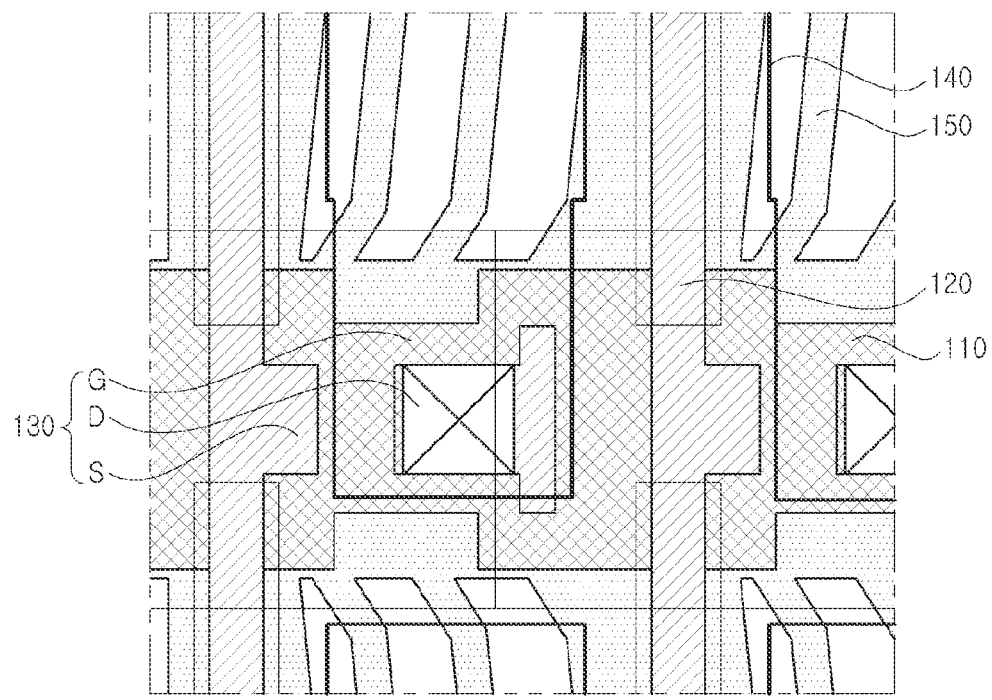
FIG. 3 is a diagram illustrating an enlarged portion in which a TFT of FIG. 2 is formed.

FIG. 2 is a diagram illustrating a pixel structure of an LCD device according to an embodiment of the present invention, and FIG. 3 is a diagram illustrating an enlarged portion in which a TFT of FIG. 2 is formed.

FIGS. 2 and 3 illustrate a pixel structure of a TFT array substrate (a lower substrate) which is driven in an FFS mode, and illustrate a portion of a plurality of pixels. A color filter array substrate (an upper substrate), a backlight unit, and a driving circuit unit are not illustrated.

The driving circuit unit includes a timing controller (T-con), a data driver (D-IC), a gate driver (G-IC), a backlight driver, and a power supply that supplies driving power to a plurality of driving circuits.

Here, all or some of the driving circuit unit may be provided on a liquid crystal panel in a chip-on glass (COG) type or a chip-on film (COF, chip-on flexible printed circuit) type.

Referring to FIGS. 2 and 3, a plurality of pixels are formed on the TFT array substrate of the liquid crystal panel, and are defined by a plurality of gate lines 110 and a plurality of data lines 120 which are formed to intersect each other.

The gate lines 110 are formed in a first direction (for example, an X axis direction, and the data lines 120 are formed in a second direction (for example, a Y axis direction). The gate lines 110 and the data lines 120 are formed in a long bar shape.

In the LCD device according to an embodiment of the present invention, the gate lines 110 and the data lines 120 are formed so that a profile of an opening of each of the pixels has a tetragonal shape. That is, a data line of a related art LCD device is formed to be inclined at a certain angle in a diagonal direction, but the data lines of the LCD device according to an embodiment of the present invention are formed in a straight line in a vertical direction.

A pixel electrode 140 and a common electrode 150 are formed in a pixel area formed by intersection between the gate line 110 and the data line 120. The pixel electrode 140 and the common electrode 150 are formed on different layers.

The pixel electrode 140 is formed to have a tetragonal shape in an opening of each pixel. That is, the pixel electrode 140 is formed in a tetragonal shape along a profile of the pixel area. The common electrode 150 is formed to have a plurality of finger patterns, and is formed to be inclined at a certain angle in each pixel.

The common electrode 150 is electrically connected to a common electrode line (not shown) through a contact hole (not shown) which is formed at one side of each pixel, and is supplied with a common voltage (Vcom).

A TFT 130 is formed in each of a plurality of areas defined by intersections between the plurality of gate lines 110 and the plurality of data lines 120. A drain electrode D of the TFT 130 is electrically connected to the pixel electrode 140 through a contact hole. The contact hole which connects the drain electrode D of the TFT 130 to the pixel electrode 140 is formed on the gate line 110, for reducing a loss of an aperture ratio. Here, the contact hole may be formed to have a 4 um×4 um to 14 um×10 um size.

Figure 4:
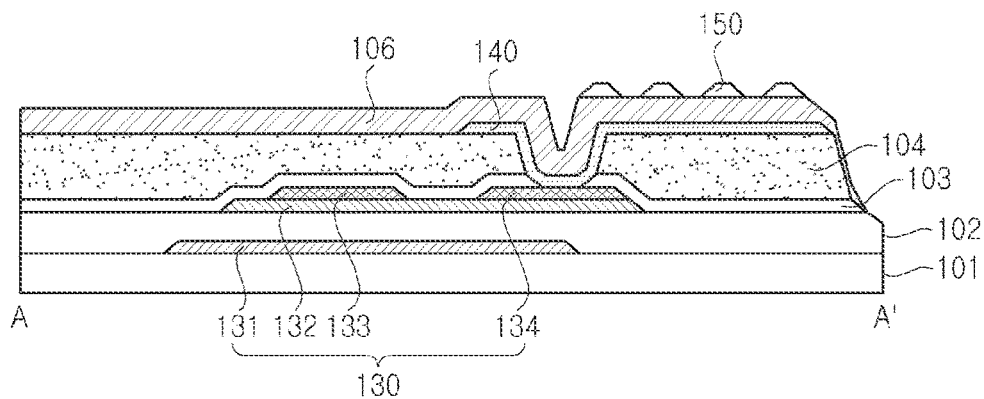
FIG. 4 is a cross-sectional view taken along line A-A' of FIG. 2.

FIG. 4 is a cross-sectional view taken along line A-A' of FIG. 2.

A pixel structure of an LCD device according to an embodiment of the present invention will be described in more detail with reference to FIG. 4.

A substrate 101 may use a glass substrate or a flexible plastic substrate. A gate electrode 131 of the TFT 130 is formed in a TFT area on the substrate 101. An area of the gate line 110 which is formed in a horizontal direction extends from the TFT area, and thus, the gate electrode 131 of the TFT 130 is formed.

The gate lines 110 and the gate electrode 131 may be formed of a metal material such as aluminum (Al), molybdenum (Mo), titanium (Ti), silver (Ag), gold (Au), nickel (Ni), cadmium (Cd), hafnium (Hf), tungsten (W), tantalum (Ta), chromium (Cr), zirconium (Zr), or copper (Cu) to have a thickness of 2,500 Å.

As another example, the gate lines 110 and the gate electrode 131 may be formed of an alloy containing a metal material such as aluminum (Al), molybdenum (Mo), titanium (Ti), silver (Ag), gold (Au), nickel (Ni), cadmium (Cd), hafnium (Hf), tungsten (W), tantalum (Ta), chromium (Cr), zirconium (Zr), or copper (Cu).

Although not shown, a buffer layer may be formed on a substrate, and the gate line 110, the gate electrode 131, and a common electrode line (not shown) may be formed on the buffer layer. The buffer layer may be formed of an inorganic material (for example, $SiO_2$ or SiNx), and may have a thickness of 2,000 Å to 3,000 Å.

A gate insulator 102 is formed to cover the gate line 110 and the gate electrode 131. The gate insulator 102 may be formed of $SiO_2$ or SiNx, and may have a thickness of 4,000 Å.

As another example, the gate insulator 102 may be formed to have a thickness of 4,000 Å by depositing tetra ethyl ortho silicate (TEOS) or middle temperature oxide (MTO) in a chemical vapor deposition (CVD) process.

An active layer 132 of the TFT 130 is formed on the gate insulator 102 to overlap the gate electrode 131. The active layer 132 may be formed of a semiconductor material to have a thickness of 2,200 Å. In this case, the semiconductor material of the active layer 132 may use poly silicon (P—Si), amorphous silicon (a-Si), low temperature poly silicon (LTPS), or oxide.

A source electrode 133 of the TFT 130 is formed at one side on the active layer 132, and a drain electrode 134 is formed at the other side. The data line 120 extends into a pixel area to form the source electrode 133. The drain electrode 134 is formed to have an island pattern.

The data line 120, the source electrode 133, and the drain electrode 134 may be formed of a metal material such as aluminum (Al), molybdenum (Mo), titanium (Ti), silver (Ag), gold (Au), nickel (Ni), cadmium (Cd), hafnium (Hf), tungsten (W), tantalum (Ta), chromium (Cr), zirconium (Zr), or copper (Cu) to have a thickness of 2,500 Å.

As another example, the data line 120, the source electrode 133, and the drain electrode 134 may be formed of an alloy containing a metal material such as aluminum (Al), molybdenum (Mo), titanium (Ti), silver (Ag), gold (Au), nickel (Ni), cadmium (Cd), hafnium (Hf), tungsten (W), tantalum (Ta), chromium (Cr), zirconium (Zr), or copper (Cu) to have a thickness of 2,500 Å.

As described above, the gate electrode 131, the gate insulator 102, the active layer 132, the source electrode 133, and the drain electrode 134 are formed to configure the TFT 130.

A first passivation layer (PAS1) 103 is formed to cover the TFT 130. The first passivation layer 103 may be formed of $SiO_2$ or SiNx to have a thickness of 1,000 Å.

A planarizing layer 104 is formed to cover an entire surface of the substrate. The planarizing layer 104 is formed of photoacryl to have a thickness of 2.0 um to 3.0 um, and planarizes the entire surface of the substrate.

The pixel electrode 140 is formed in an opening of the planarizing layer 104. A contact hole is formed to expose a portion of a top of the drain electrode 134. The pixel electrode 140 is formed in the contact hole, and is electrically connected to the drain electrode 134 of the TFT 130 and the pixel electrode 140.

A second passivation layer (PAS2) 106 is formed to cover the pixel electrode 140. The second passivation layer 106 may be formed of $SiO_2$ or SiNx to have a thickness of 2,000 Å.

The common electrode 150 is formed on the second passivation layer 106. The common electrode 150 is formed to have a plurality of finger patterns. The common electrode 150 is formed to be inclined at a certain angle relative to data lines 120 in each pixel. The common electrode 150 is electrically connected to the common electrode line (not shown) through the contact hole (not shown) which is formed at one side of each pixel, and is supplied with the common voltage (Vcom).

As described above, the pixel electrode 140 and the common electrode 150 are formed on different layers, and a fringe field is generated between the pixel electrode 140 and the common electrode 150.

The pixel electrode 140 and the common electrode 150 are formed of a transparent conductive material such as indium tin oxide (ITO), indium zinc oxide (IZO), or indium tin zinc oxide (ITZO) to have a thickness of 400 Å.

Although not shown, in order for a space to be formed between the lower substrate (the TFT array substrate) and the upper substrate (the color filter array substrate), a column spacer CS is formed on the lower substrate (the TFT array substrate). Liquid crystal is injected into the space formed between the lower substrate (the TFT array substrate) and the upper substrate (the color filter array substrate).

A black matrix BM for dividing the plurality of pixels is formed on the upper substrate (the color filter array substrate) in which a color filter is formed. The black matrix is formed to overlap the gate lines 110 and the data line 120, for reducing a loss of an opening of each pixel. In this case, except for a portion for covering the column spacer, the black matrix is formed in a tetragonal shape.

In the LCD device according to an embodiment of the present invention including the above-described elements, the gate lines and the data lines are formed so that a profile of an opening of each pixel has a tetragonal shape. The pixel electrode is formed in a tetragonal shape in the opening of each pixel. That is, the data line 120 and pixel electrode 140 of each of pixels which are adjacent in an up and down direction or in a left and right direction are formed in a substantially same shape.

Therefore, even when an overlap of metals is distorted in a manufacturing process, an area in which metals of the pixels overlap each other is substantially same as a distorted area, and thus, a defect caused by capacitance differences of the pixels can be prevented. Accordingly, the capacitances of the pixels are equal, and thus, line dim in a height direction and a width direction and flicker can be prevented.

FIGS. 5 to 12 are diagrams illustrating a method of manufacturing an LCD device according to an embodiment of the present invention.

Hereinafter, a method of manufacturing an LCD device according to an embodiment of the present invention will be described in detail with reference to FIGS. 5 to 12.

Figure 5:
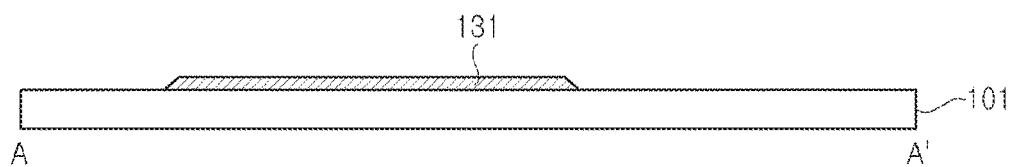
FIG. 5 is a diagram illustrating an LCD device in a first state of manufacturing process, according to an embodiment of the present invention.

Referring to FIG. 5, a metal material is coated on the substrate 101, and then a plurality of gate lines, a plurality of common electrode lines, and the gate electrode 131 of each pixel area are formed by performing a photolithography process, an etching process, and an ashing process which use a first mask (Mask 1). In this case, the plurality of gate lines are formed in a first direction (for example, an X axis direction). An area of the gate line which is formed in the first direction (for example, a horizontal direction) extends from a TFT area, and thus, the gate electrode 131 of a TFT is formed. The substrate 101 may use a glass substrate or a flexible plastic substrate.

Although not shown, a buffer layer may be formed on a substrate, and the gate line, the gate electrode 131, and the common electrode line (not shown) may be formed on the buffer layer. The buffer layer may be formed of an inorganic material (for example, $SiO_2$ or SiNx), and may have a thickness of 2,000 Å to 3,000 Å.

The gate lines and the gate electrode 131 may be formed on the same layer, and may be formed of a metal material such as aluminum (Al), molybdenum (Mo), titanium (Ti), silver (Ag), gold (Au), nickel (Ni), cadmium (Cd), hafnium (Hf), tungsten (W), tantalum (Ta), chromium (Cr), zirconium (Zr), or copper (Cu) to have a thickness of 2,500 Å.

As another example, the gate lines and the gate electrode 131 may be formed of an alloy containing a metal material such as aluminum (Al), molybdenum (Mo), titanium (Ti), silver (Ag), gold (Au), nickel (Ni), cadmium (Cd), hafnium (Hf), tungsten (W), tantalum (Ta), chromium (Cr), zirconium (Zr), or copper (Cu) to have a thickness of 2,500 Å.

Figure 6:
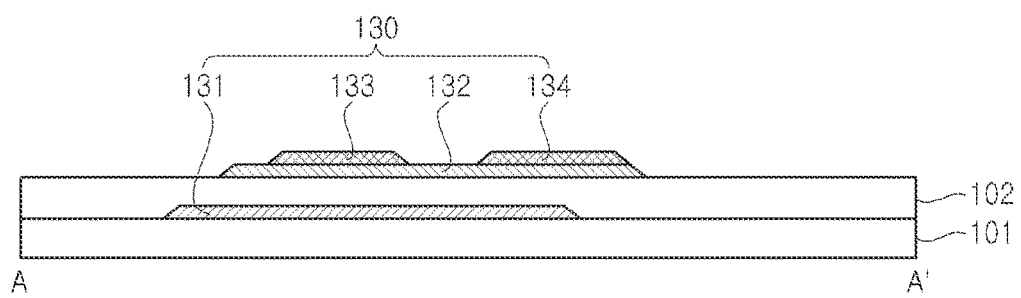
FIG. 6 is a diagram illustrating an LCD device in a second state of manufacturing process, according to an embodiment of the present invention.

Subsequently, referring to FIG. 6, the gate insulator 102 is formed to cover the gate line and the gate electrode 131. The gate insulator 102 may be formed of $SiO_2$ or SiNx, and may have a thickness of 4,000 Å.

As another example, the gate insulator 102 may be formed to a thickness of 4,000 Å by depositing tetra ethyl ortho silicate (TEOS) or middle temperature oxide (MTO) in a chemical vapor deposition (CVD) process.

Subsequently, a semiconductor material is deposited on the gate insulator 102, and a metal material is coated on the semiconductor material.

Subsequently, the active layer 132 is formed to a thickness of 2,200 Å to overlap the gate electrode 131 by performing a photolithography process, an etching process, and an ashing process which use a second mask (Mask 2). Furthermore, when forming the active layer 132, the data line 120, the source electrode 133, and the drain electrode 134 are simultaneously formed to a thickness of 2,500 Å. At this time, a half tone mask is used as the second mask so as to simultaneously form the active layer 132 and a source/drain layer.

A photoresist is coated, and then, the active layer 132 and the source/drain layer are simultaneously formed by performing a photolithography process, an etching process, and an ashing process which use the half tone mask.

Here, the photoresist may use a negative photoresist in which an exposed area remains. The half tone mask includes a full tone area, a half tone area, and a blocking area.

Substantially all of a photoresist corresponding to the full tone area remain. Thus, the photoresist corresponding to the full tone area becomes thick. In a photoresist corresponding to the half tone area, an amount of remaining photoresist (an amount of removed photoresist) is adjusted according to an amount of transmitted light, namely, an amount of exposure, and thus, the photoresist corresponding to the half tone area becomes thinner than the photoresist corresponding to the full tone area. Also, a photoresist corresponding to the blocking area is not exposed, and thus substantially all of the photoresist corresponding to the blocking area is removed.

A plurality of data lines are formed in a second direction (for example, a Y axis direction).

When forming the data line, the source electrode 133 and the drain electrode 134 are formed in each pixel. The source electrode 133 is formed at one side on the active layer 132, and the drain electrode 134 is formed at the other side. The data line extends into a pixel area to form the source electrode 133. The drain electrode 134 is formed to have an island pattern.

Here, the semiconductor material of the active layer 132 may use poly silicon (P—Si), amorphous silicon (a-Si), low temperature poly silicon (LTPS), or oxide.

The data line, the source electrode 133, and the drain electrode 134 may be formed on the same layer, and may be formed of a metal material such as aluminum (Al), molybdenum (Mo), titanium (Ti), silver (Ag), gold (Au), nickel (Ni), cadmium (Cd), hafnium (Hf), tungsten (W), tantalum (Ta), chromium (Cr), zirconium (Zr), or copper (Cu) to have a thickness of 2,500 Å.

As another example, the data line, the source electrode 133, and the drain electrode 134 may be formed on the same layer, and may be formed of an alloy containing a metal material such as aluminum (Al), molybdenum (Mo), titanium (Ti), silver (Ag), gold (Au), nickel (Ni), cadmium (Cd), hafnium (Hf), tungsten (W), tantalum (Ta), chromium (Cr), zirconium (Zr), or copper (Cu) to have a thickness of 2,500 Å.

As described above, the gate electrode 131, the gate insulator 102, the active layer 132, the source electrode 133, and the drain electrode 134 are formed to configure the TFT 130.

Figure 7:
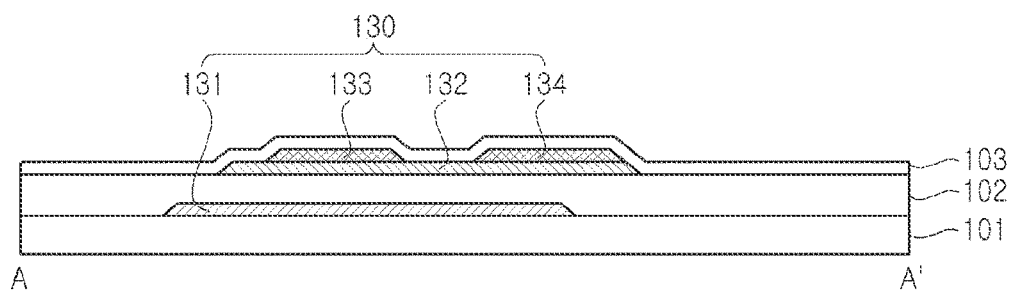
FIG. 7 is a diagram illustrating an LCD device in a third state of manufacturing process, according to an embodiment of the present invention.

Subsequently, referring to FIG. 7, the TFT 130 is formed, and then, $SiO_2$ or SiNx is coated over the substrate to a thickness of 1,000 Å, and the first passivation layer 103 is formed to cover the TFT 130.

Figure 8:
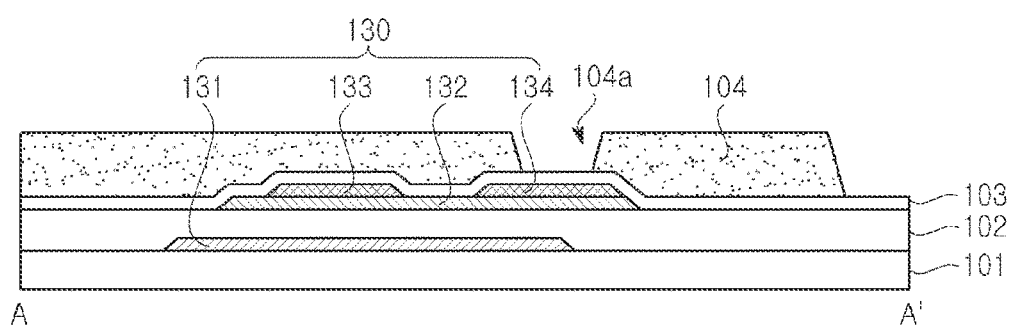
FIG. 8 is a diagram illustrating an LCD device in a fourth state of manufacturing process, according to an embodiment of the present invention.

Subsequently, referring to FIG. 8, the planarizing layer 104 is formed by coating photoacryl on the entire surface of the substrate 101 to cover the first passivation layer 103. In this case, the planarizing layer 104 is formed to a thickness of 2.0 um to 3.0 um, and planarizes the entire surface of the substrate.

Subsequently, a portion 104a of the planarizing layer 104 in an area overlapping the drain electrode 134 is removed by performing an etching process and an ashing process which use a third mask (Mask 3). The first passivation layer 103 in the area overlapping the drain electrode 134 is exposed by removing the portion 104a of the planarizing layer 104.

Figure 9:
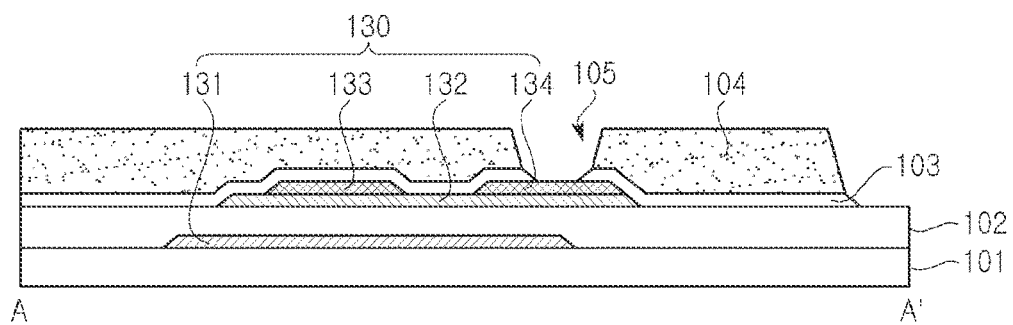
FIG. 9 is a diagram illustrating an LCD device in a fifth state of manufacturing process, according to an embodiment of the present invention.

Subsequently, referring to FIG. 9, the first passivation layer 103 in the area overlapping the drain electrode 134 is removed by performing a dry etching process. A contact hole 105 which exposes the drain electrode 134 is formed by removing the first passivation layer 103 in the area overlapping the drain electrode 134.

Here, the contact hole 105 connects the drain electrode D of the TFT 130 to the pixel electrode 140, and is formed on the gate line 110, for reducing a loss of an aperture ratio. Here, the contact hole 105 may be formed to have a 4 um×4 um to 14 um×10 um size.

Figure 10:
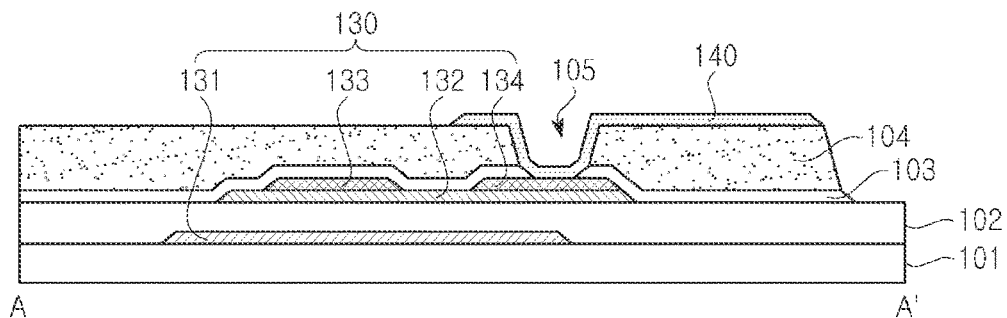
FIG. 10 is a diagram illustrating an LCD device in a sixth state of manufacturing process, according to an embodiment of the present invention.

Subsequently, referring to FIG. 10, a transparent conductive material such as indium tin oxide (ITO), indium zinc oxide (IZO), or indium tin zinc oxide (ITZO) is coated over the substrate 101 to a thickness of 400 Å.

Subsequently, the pixel electrode 140 is formed in a pixel area (an opening) by performing a photolithography process, an etching process, and an ashing process which use a fourth mask (Mask 4).

The pixel electrode 140 is formed to have a tetragonal shape in an opening of each pixel. The pixel electrode 140 is also formed in the contact hole 105, and is electrically connected to the drain electrode D of the TFT 130 through the contact hole 105.

Figure 11:
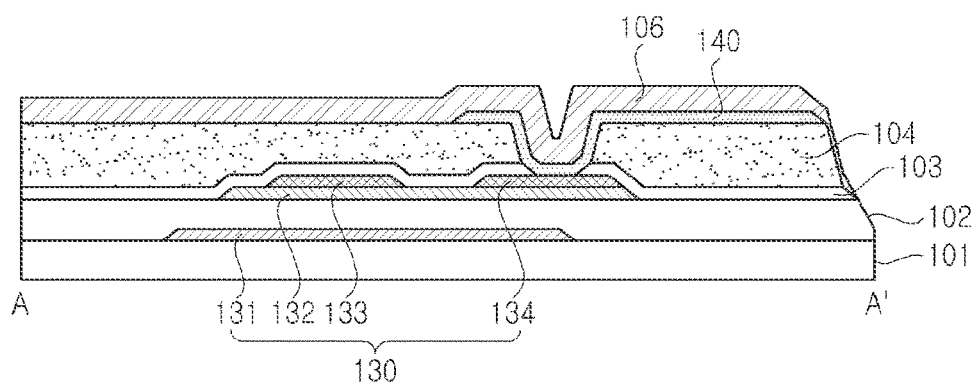
FIG. 11 is a diagram illustrating an LCD device in a seventh state of manufacturing process, according to an embodiment of the present invention.

Subsequently, referring to FIG. 11, the second passivation layer (PAS2) 106 is formed to cover the pixel electrode 140. The second passivation layer 106 may be formed of $SiO_2$ or SiNx to have a thickness of 2,000 Å.

Here, although not shown, a gate pad, a data pad, a gate link, and a data link are provided in a pad area outside an active area. In this case, the second passivation layer 106 is also formed on the gate pad, the data pad, the gate link, and the data link.

By performing a photolithography process, an etching process, and an ashing process which use a fifth mask (Mask 5), a plurality of contact holes are formed by removing a portion of the second passivation layer 106 formed in a pad area so that the gate pad, the data pad, the gate link, and the data link are exposed.

Figure 12:
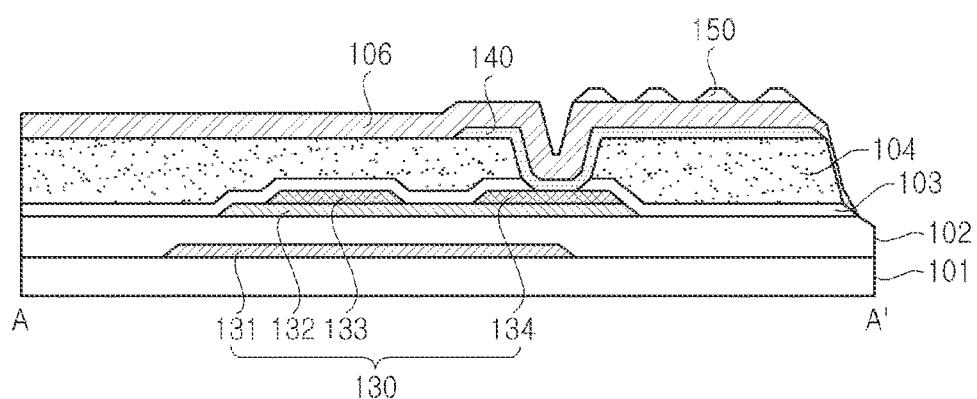
FIG. 12 is a diagram illustrating an LCD device in an eight state of manufacturing process, according to an embodiment of the present invention.

Subsequently, referring to FIG. 12, a transparent conductive material such as indium tin oxide (ITO), indium zinc oxide (IZO), or indium tin zinc oxide (ITZO) is coated on the second passivation layer 106 to a thickness of 400 Å.

Subsequently, the common electrode 150 having a plurality of finger patterns is formed by performing a photolithography process, an etching process, and an ashing process which use a sixth mask (Mask 6).

The common electrode 150 is formed to be inclined at a certain angle relative to data lines 120 in each pixel. The common electrode 150 is electrically connected to the common electrode line (not shown) through the contact hole (not shown) which is formed at one side of each pixel, and is supplied with the common voltage (Vcom).

As described above, the pixel electrode 140 and the common electrode 150 are formed on different layers, and a fringe field is generated between the pixel electrode 140 and the common electrode 150.

The pixel electrode 140 and the common electrode 150 are formed of a transparent conductive material such as indium tin oxide (ITO), indium zinc oxide (IZO), or indium tin zinc oxide (ITZO) to have a thickness of 400 Å.

Although not shown, in order for a space to be formed between the lower substrate (the TFT array substrate) and the upper substrate (the color filter array substrate), the column spacer CS is formed on the lower substrate (the TFT array substrate).

Subsequently, when the lower substrate (the TFT array substrate) is coupled to the upper substrate (the color filter array substrate), the space is provided between the lower substrate (the TFT array substrate) and the upper substrate (the color filter array substrate) by the column spacer.

Subsequently, liquid crystal is injected into the space formed between the lower substrate (the TFT array substrate) and the upper substrate (the color filter array substrate), and then, sides of the lower substrate (the TFT array substrate) and the upper substrate (the color filter array substrate) are sealed in order to prevent the liquid crystal from flowing out.

A red color filter, a green color filter, and a blue color filter are formed on the upper substrate (the color filter array substrate) in correspondence with a pixel area, and the black matrix BM for dividing the plurality of pixels is formed on the upper substrate (the color filter array substrate).

The black matrix is formed to overlap the gate lines 110 and the data line 120, for reducing a loss of an opening of each pixel. In this case, except for a portion for covering the column spacer, the black matrix is formed in a tetragonal shape. By using the method of manufacturing the LCD device according to an embodiment of the present invention, the gate lines and the data lines are formed so that a profile of an opening of each pixel has a tetragonal shape. The pixel electrode is formed in a tetragonal shape in the opening of each pixel. That is, the data line 120 and pixel electrode 140 of each of pixels which are adjacent in an up and down direction or in a left and right direction are formed in a substantially same shape.

Therefore, even when an overlap of metals is distorted in a manufacturing process, an area in which metals of the pixels overlap each other is substantially same as a distorted area, and thus, a defect caused by capacitances differences of the pixels can be prevented. Accordingly, the capacitances of the pixels are equal, and thus, line dim in a height direction and a width direction and flicker can be prevented.

TABLE 1

|  | The Related Art | The Present Invention |
| --- | --- | --- |
| Cgs | Upper and lower pixel difference: 47.8% | Upper and lower pixel difference: 0% |

TABLE 1-continued

|  | The Related Art | The Present Invention |
|---|---|---|
| Cst | Left and right pixel difference: 0% | Left and right pixel difference: 0% |
|  | Upper and lower pixel difference: 2.05% | Upper and lower pixel difference: 0% |
|  | Left and right pixel difference: 3.18% | Left and right pixel difference: 0% |
| Cdp | Upper and lower pixel difference: 0% | Upper and lower pixel difference: 0% |
|  | Left and right pixel difference: 13.86% | Left and right pixel difference: 0% |

Figure 13:
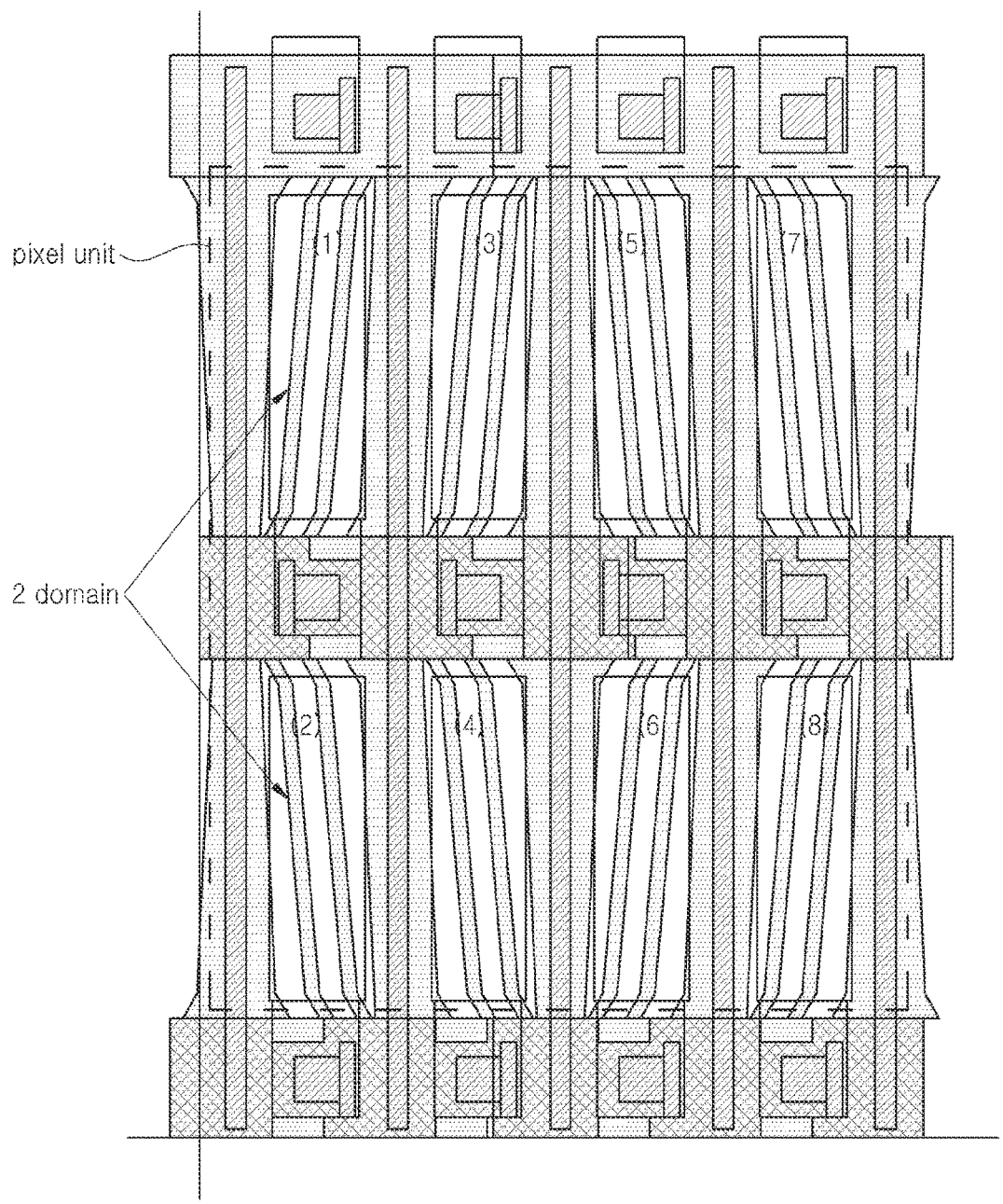
FIG. 13 is a diagram illustrating a structure of pixels of an LCD device according to an embodiment of the present invention.

As listed in Table 1, in the relate art, since an overlap of metals is distorted in a manufacturing process, capacitances of pixels differ. On the other hand, an area in which metals of the pixels overlap each other is substantially same as a distorted area, and thus, capacitances of the pixels are substantially same. FIG. 13 is a diagram illustrating an arrangement structure of pixels of an LCD device according to an embodiment of the present invention.

Referring to FIG. 13, in the LCD device according to an embodiment of the present invention, two domains may be formed by two pixels which are adjacent upward and downward.

Moreover, one pixel unit may be composed of eight pixels which are adjacent in an up and down direction and a left and right direction. The pixel unit may be repeatedly disposed. An angle of a common electrode of a pixel in the up direction relative to the data lines may be different from an angle of a common electrode of a pixel in the down direction relative to the data lines.

The LCD device and the method of manufacturing the same according to the embodiments of the present invention can prevent a capacitance deviation between pixels from occurring.

The LCD device and the method of manufacturing the same according to the embodiments of the present invention can prevent a quality of an image from being degraded by line dim in a horizontal and vertical direction and flicker.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A liquid crystal display (LCD) device comprising:
a plurality of gate lines disposed in a first direction on a substrate;
a plurality of data lines disposed in a second direction to intersect the plurality of gate lines;
a thin film transistor (TFT) disposed in each of a plurality of pixel areas defined by the plurality of gate lines and the plurality of data lines;
a pixel electrode disposed in a tetragonal shape in each of the plurality of pixel areas, the pixel electrode disposed in the tetragonal shape extending over a gate line of the plurality of gate lines, the pixel electrode disposed in the tetragonal shape coupled to the TFT through a contact hole, the contact hole formed in a region at which the gate line, the pixel electrode, and the TFT overlap with each other; and
a common electrode disposed on the pixel electrode, and configured to include a plurality of finger patterns,
wherein each of the plurality of pixel areas is disposed in a tetragonal shape.

2. The LCD device of claim 1, wherein,
the pixel electrode is disposed in the tetragonal shape along a profile of a corresponding pixel area, and
the common electrode is disposed to be inclined at a certain angle relative to the plurality of data lines.

3. The LCD device of claim 1, wherein the plurality of data lines are disposed in straight lines.

4. The LCD device of claim 1, wherein pixel electrodes of pixels which are adjacent in an up and down direction and a left and right direction are disposed in a substantially same shape.

5. The LCD device of claim 1, wherein,
a black matrix which defines an opening of each of the plurality of pixel areas is disposed on another substrate above the substrate, and the black matrix is disposed in a tetragonal shape.

6. The LCD device of claim 1, wherein two domains are disposed by two pixels which are adjacent upward and downward.

7. The LCD device of claim 6, wherein an angle of a common electrode of a pixel in a first domain of the two domains relative to the plurality of data lines is different from an angle of a common electrode of a pixel in a second domain of the two domains relative to the plurality of data lines.

8. The LCD device of claim 1, wherein,
one pixel unit is composed of eight pixels, and
the one pixel unit is repeatedly disposed.

9. A method of manufacturing a liquid crystal display (LCD) device, the method comprising:
forming a plurality of gate lines in a first direction on a substrate, and forming a gate electrode of a thin film transistor (TFT);
forming a gate insulator to cover the plurality of gate lines and the gate electrode;
forming an active layer on the gate insulator in an area which overlaps the gate electrode;
forming a plurality of data lines in a second direction on the substrate, and forming a source electrode and a drain electrode of the TFT;
forming a first passivation layer and a planarizing layer to cover the plurality of data lines and the TFT, and forming a contact hole to expose a top of the drain electrode;
forming a pixel electrode in a tetragonal shape in each of a plurality of pixel areas defined by intersections between the plurality of gate lines and the plurality of data lines, the pixel electrode formed in the tetragonal shape extending over a gate line of the plurality of gate lines, the pixel electrode disposed in the tetragonal shape coupled to the TFT through the contact hole, the contact hole formed in a region at which the gate line, the pixel electrode, and the TFT overlap with each other;
forming a second passivation layer to cover the pixel electrode; and
forming a common electrode, which includes a plurality of finger patterns, on the second passivation layer,
wherein each of the plurality of pixel areas is formed in a tetragonal shape.

10. The method of claim 9, wherein,
the pixel electrode is formed in the tetragonal shape along a profile of a corresponding pixel area, and
the common electrode is formed to be inclined at a certain angle relative to the plurality of data lines.

11. The method of claim 9, wherein the plurality of data lines are formed in straight lines.

12. The method of claim 9, wherein pixel electrodes of pixels which are adjacent are formed in a substantially same shape.

13. The method of claim 9, further comprising forming a black matrix, which defines an opening of each of the plurality of pixel areas, on another substrate above the substrate, wherein the black matrix is disposed in a tetragonal shape.

* * * * *